(12) United States Patent
Sporer et al.

(10) Patent No.: US 10,103,466 B1
(45) Date of Patent: Oct. 16, 2018

(54) DOUBLE-THREADED CONNECTOR

(71) Applicant: General Electric Company, Schenectady, NY (US)

(72) Inventors: Bernd Sporer, Augsburg (DE); Klaus Weinmann, Augsburg (DE); Andreas Pitzl, Augsburg (DE); Thomas Kirsch, Augsburg (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/597,957

(22) Filed: May 17, 2017

(51) Int. Cl.
| | |
|---|---|
| *H01R 12/73* | (2011.01) |
| *F16B 5/02* | (2006.01) |
| *H05K 1/14* | (2006.01) |
| *H05K 3/36* | (2006.01) |
| *H01R 12/72* | (2011.01) |

(52) U.S. Cl.
CPC .......... *H01R 12/73* (2013.01); *F16B 5/0283* (2013.01); *H01R 12/721* (2013.01); *H05K 1/141* (2013.01); *H05K 3/366* (2013.01); *H05K 2201/042* (2013.01); *H05K 2201/10409* (2013.01)

(58) Field of Classification Search
CPC ....................................................... H05K 7/142
USPC ................................ 361/758, 807, 810, 804
See application file for complete search history.

(56) References Cited

U.S. PATENT DOCUMENTS

| | | | |
|---|---|---|---|
| 5,173,842 A | 12/1992 | Depew | |
| 5,573,409 A | 11/1996 | Shiley et al. | |
| 6,280,202 B1* | 8/2001 | Alden, III | H05K 7/142 |
| | | | 174/138 D |
| 6,493,233 B1* | 12/2002 | De Lorenzo | H05K 3/325 |
| | | | 174/138 G |
| 9,374,900 B2* | 6/2016 | Huffman | H05K 1/144 |
| 2009/0275985 A1 | 11/2009 | Jackson | |
| 2015/0146400 A1* | 5/2015 | Huffman | H05K 1/144 |
| | | | 361/790 |
| 2015/0152906 A1* | 6/2015 | Lai | F16B 5/065 |
| | | | 411/403 |

(Continued)

FOREIGN PATENT DOCUMENTS

| | | |
|---|---|---|
| CN | 100472686 | 3/2009 |
| CN | 205104842 | 3/2016 |
| JP | 2012104600 | 5/2012 |

OTHER PUBLICATIONS

Test Fixture, Dec. 24, 2015, 5 pages. [retrieved on line] https://aws.nlited.org/p525.htm.

(Continued)

*Primary Examiner* — Ross Gushi
(74) *Attorney, Agent, or Firm* — Armstrong Teasdale LLP

(57) ABSTRACT

A double-threaded connector or spacer according may be self-threading such that insertion into a mounting hole in a PCB will cause the interior of the mounting hole to become threaded to match the double-threaded connector or spacer. The double- threaded connector or spacer installed in a mounting hole of a carrier. A "half circle" portion of daughter card is held in place between the double-threaded connector or spacer and screw. The half circle portion of the daughter card is plated to make electrical contact with the double-threaded connector or spacer, for example, to allow for grounding of the daughter card via the carrier, e.g., PCB.

19 Claims, 5 Drawing Sheets

(56) References Cited

U.S. PATENT DOCUMENTS

2015/0168456 A1    6/2015  Dominizi et al.

OTHER PUBLICATIONS

Teitelman, XSPC Raystorm 750 EX240 Watercooling Kit Review, PC Perspective, Oct. 14, 2013, 10 pages. [retrieved on line] https://www.pcper.com/reviews/Cases-and-Cooling/XSPC-Raystorm-750-EX240-Watercooling-Kit-Review/Included-Accessories.
Mahato et al., A Study on Anti-Loosening Characteristics of Different 3/8 BSW Threaded Fasteners, 14th National Conference on Machines and Mechanisms, 2009, 7 pages.

* cited by examiner

DOUBLE-THREADED CONNECTOR

BACKGROUND

Examples of the present disclosure relate to a connector or spacer for use within an electronic assembly to provide mounting and fixation capability in general for any kind of daughter cards, specifically a double-threaded connector or spacer.

Electronic devices and electronic assemblies often have a modular concept. The benefit of a modular concept is flexibility and specialization. For example, an Industrial Personal Computer (IPC), may be constructed and designed either with a monolithic PCBA (Printed Circuit Board Assembly) or may have modularity. One example of a modular design may have a (Computer-on-Module) COM Express® Module, a carrier (e.g., a PCBA), which may provide Input/Output (10) connectivity, and various daughter cards.

FIG. 1 illustrates examples of a standard daughter M.2 modules, which are merely provided herein for reference, but the disclosure is not limited to use only with M.2 modules. That is, the principles described herein may applicable to any daughter module installation on a carrier. M.2 modules are available in different sizes, such as 42 mm, 60 m and 80 mm. The modularity and the exchangeability are great advantages of those modules.

FIG. 2 illustrates the installation of a module to a carrier. The fixation of the exemplary module is realized with a solder in nut and a screw, which clamps the module. That is, as illustrated in the example of FIG. 2, a carrier, e.g., a printed circuit board (PCB) 210 includes plurality of components, including plurality of mounting holes 214. The mounting holes 214 have different locations on the PCB 210 to accommodate different sized modules. To mount an exemplary module 212 on the PCB, an "off the shelf" solder in nut is installed using a surface-mount technology (SMT) soldering process. In such process, solder in nut 216 is provided in the PCB 210 for the mounting of the module. The module 212, which may include a half-circle cut out at one end for mounting, is placed to abut the nut, pressed into place, and a screw 218 is inserted into the nut to secure the module.

This is approach works well as long the size of module required is known in advance of the SMT soldering process. For example, it is difficult to exchange a module once it is installed to replace it with a module of a different size, e.g., for a larger or smaller module. The difficulty arises because the solder in nut would need to be moved in order to the position the new module of different size. Such solder removal is nearly impossible to do in the field and could result in damage to the module, the board or the nut. Therefore, such "in-the-field" module change is impractical. Moreover, it is difficult to provide in advance all the solder in nuts in the board to accommodate later module change because the provided solder in nuts would interfere with the location and positioning of the modules. Other solutions on the market with spacers and nuts are not user-friendly because they require access from both sides of the carrier.

BRIEF SUMMARY OF THE DISCLOSURE

In accordance with the purpose(s) of this disclosure, as embodied and broadly described herein, this disclosure, in one aspect, relates to a component for installation on a carrier that includes an outer body; a cylindrical cap on the outer body and having a width less than a width of the outer body; a cylindrical stage extending from the outer body in a direction opposite the cylindrical cap; a threaded bore extending through the cylindrical cap and outer body and into the cylindrical stage; and an outer thread extending on an external surface of the cylindrical stage.

In an aspect, the disclosure relates to a printed circuit board, comprising a carrier having at least one mounting hole there through; a daughter board having a mounting recess along a side thereof; a component extending through one of the at least one mounting holes; the component comprising: an outer body; a cylindrical cap on the outer body and having a diameter less than a width of the outer body; a cylindrical stage extending from the outer body in a direction opposite the cylindrical cap and having a diameter less than a width of the outer body; a threaded bore extending through the cylindrical cap and outer body and into the cylindrical stage; an outer thread extending on an external surface of the cylindrical stage; and a screw extending through the threaded bore; wherein a portion of the daughter board contacts the component.

In an aspect, the disclosure relates to a method of installing a daughter board on a mother board, comprising threading a component into a mounting hole on the mother board, the component comprising: an outer body; a cylindrical cap on the outer body and having a diameter less than a width of the outer body; a cylindrical stage extending from the outer body in a direction opposite the cylindrical cap and having a diameter less than a width the outer body; a threaded bore extending through the cylindrical cap and outer body and terminating within the cylindrical stage; an outer thread extending on an external surface of the cylindrical stage; providing a daughter card adjacent the component; and applying a screw in the threaded bore causing the component to removably clamp the daughter board to the component.

Additional advantages of the disclosure will be set forth in part in the description which follows, and in part will be obvious from the description, or may be learned by practice of the disclosure. The advantages of the disclosure will be realized and attained by means of the elements and combinations particularly pointed out in the appended claims. It is to be understood that both the foregoing general description and the following detailed description are exemplary and explanatory only and are not restrictive of the disclosure, as claimed.

An advantage of the present disclosure is to provide an adaptable, multiple application system for attaching a daughter module to a carrier. Advantages of the present disclosure include post-factory ("in the field") removal and installation of modules without having to remove soldered-in pieces or causing damage to the modules or boards or other components.

Further examples, features, and advantages of the double-threaded spacer, as well as the structure and operation of the various examples of the double-threaded spacer, are described in detail below with reference to the accompanying drawings.

It is to be understood that both the foregoing general description and the following detailed description are exemplary and explanatory only, and are not restrictive of the claims.

BRIEF DESCRIPTION OF THE DRAWINGS

The accompanying figures, which are incorporated herein and form part of the specification, illustrate the double-threaded connector. Together with the description, the figures further serve to explain the principles of the double-threaded connector described herein and thereby enable a person skilled in the pertinent art to make and use the double-threaded connector.

DETAILED DESCRIPTION

Figure 1:
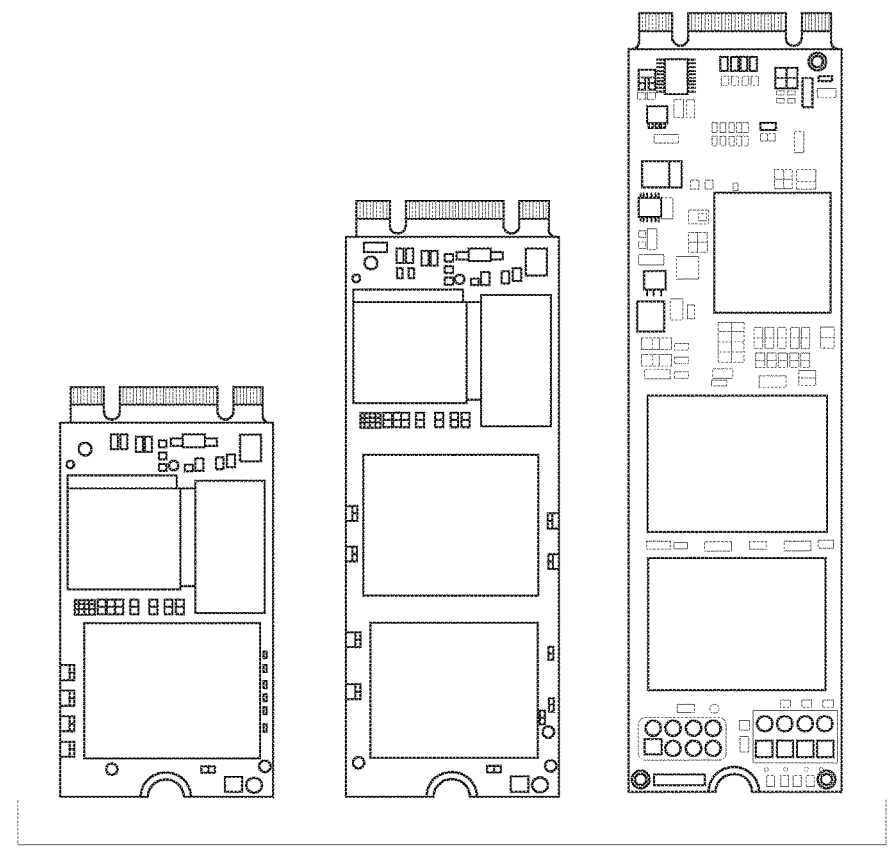
FIG. 1 is illustrates non-limiting examples of daughter card modules that can be mounted through use of an example of the present.
Figure 2:
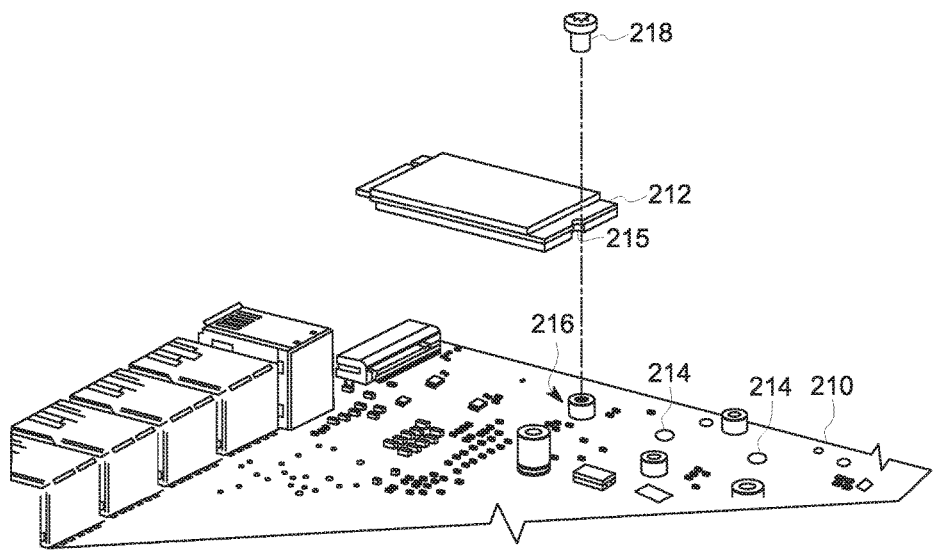
FIG. 2 illustrates the installation of a short daughter cared on a carrier.

Reference will now be made in detail to examples of the double-threaded connector or spacer with reference to the accompanying figures, in which like reference numerals indicate like elements.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

Figure 3:
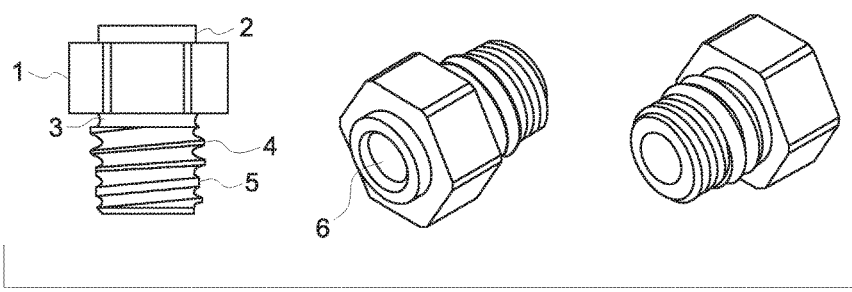
FIG. 3 illustrates a double-threaded connector according to principles of the present disclosure.

FIG. 3 illustrates a double-threaded connector or spacer according to principles of the present disclosure that allow for installation and replacement of modules of various sizes on a carrier. While the term "spacer" is used herein to refer to the component detailed herein, the component is not limited to performing a spacer function and is not required to perform a spacing function. As illustrated in the FIG. 3, an exemplary double-threaded connector, spacer or component according to principles of the present disclosure includes at least the following geometrical features: an outer body 1, a cylindrical stage 2, a recess 3 between the outer body 1 and an outer thread 4, a cylindrical stage 5, and a bore hole 6 may include inner threads (not shown). The inner thread may be of pitch to receive an "off the shelf" screw of predetermined diameter and thread, but is not so limited. The outer body 1 may be hexagonal to accommodate a hexagon spanner.

Figure 5:
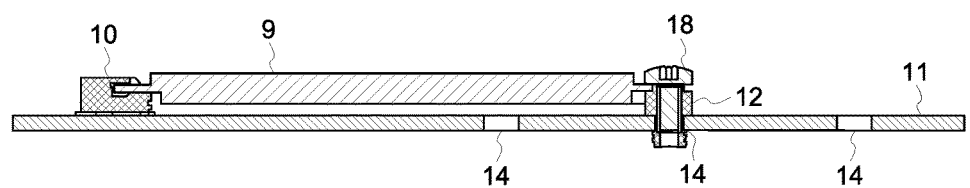
FIG. 5 illustrates the usage of the double-threaded spacer according to principles of the present disclosure.

The cylindrical stage 2 is sized to align with a half-circle cut out at one end of a module for mounting (see FIG. 5). The cylindrical stage 5 is sized in relation to a mounting hole diameter in the PCB. The cylindrical stage 5 enables the right angled/upright installation of the double-threaded connector or spacer into the PCB. The cylindrical stage 2 may provide for adjustment of the daughter card relative to the connector and the double-threaded connector or spacer.

The double-threaded connector or spacer according to principles of the present disclosure may be self-threading such that insertion into a mounting hole in a PCB will cause the interior of the mounting hole to become threaded to match the double-threaded connector or spacer, for example, by deforming the material of the PCB. As illustrated in FIG. 4, the self-threading feature of the double-threaded connector or spacer according to principles of the present disclosure may include a plurality of distal thread (or threads) 7 at a distal end of the double-threaded connector or spacer, where the plurality of distal thread (or threads) 7 may be compatible with regularly (e.g., "off-the-shelf") machined threads. Such regularly machined threads may be for use with a solder in nut on the underside of the carrier, such as a PCB. In place of the distal threads 7 may be a smooth cylinder adjacent a plurality of proximal outer threads 8. The self-threading feature of the double-threaded connector or spacer may be facilitated by hills of the distal thread (or threads) 7 having a circular or arcuate topology at a distal end of cylindrical stage 5 of the double-threaded connector or spacer such that the thread (or threads) assists in first movement of the cylindrical stage 5 into a PCB mounting hole (not shown in FIG. 3). The proximal outer thread (or threads) 8 in the proximal portion of the cylindrical stage 5 may have the same profile as or a different profile than the distal thread (or threads) 7 in the distal portion of the double-threaded connector or spacer. In other examples, all of the threads of the may be "circular" or "arcuate" or "off-the-shelf" or angular. That is, the outer thread 4 may have a thread so that the double-threaded connector or spacer can be screwed into a solder in nut, for example, mounted on the underside of the carrier or PCB. In an example for mounting an M4 board, the diameter of the proximal outer thread (or threads) 8 would be 3.75 mm, but this disclosure is not so limited and the thread diameter may range, for example, from 3.5 mm to 3.8 mm.

Figure 4A:
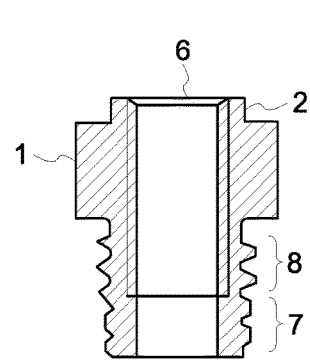
FIG. 4A illustrates a cross-sectional view of an example of the double-threaded connector according to principles of the present disclosure.
Figure 4B:
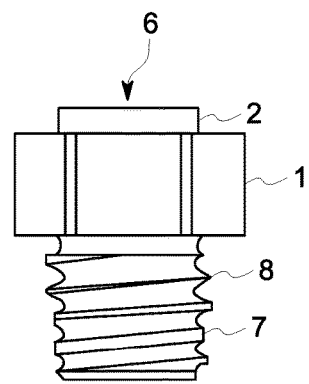
FIG. 4B illustrates a side view of an example of the double-threaded connector according to principles of the present disclosure.
Figure 4C:
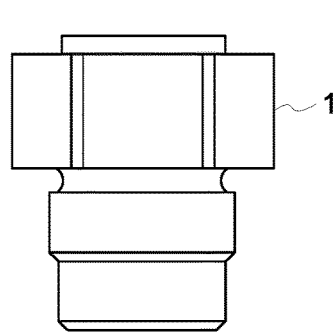
FIG. 4C illustrates a side view of an example of the double-threaded connector without threads according to principles of the present disclosure.
Figure 4D:
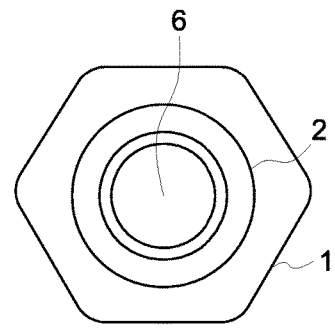
FIG. 4D illustrates a top view of an example of the double-threaded connector according to principles of the present disclosure.
Figure 4E:
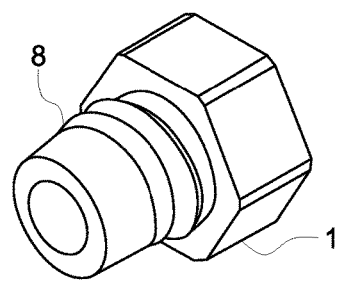
FIG. 4E illustrates an alternative example of the present disclosure in which some threads are replaced by a smooth cylinder.

The double-threaded connector or spacer according to principles of the present disclosure is further illustrated in FIGS. 4A-D. FIG. 4A illustrates a cross-sectional view of an example of the double-threaded connector or spacer according to principles of the present disclosure. FIG. 4B illustrates a side view of an example of the double-threaded connector or spacer according to principles of the present disclosure. FIG. 4C illustrates a side view of an example of the double-threaded connector or spacer without threads according to principles of the present disclosure. FIG. 4D illustrates a top view of an example of the double-threaded connector or spacer according to principles of the present disclosure. FIG. 4E illustrates an alternative example of the present disclosure in which some threads are replaced by a substantially smooth cylinder. As illustrated in FIGS. 4A-D, an exemplary double-threaded connector or spacer or component according to principles of the present disclosure includes at least the following geometrical features: an outer body 1, a cylindrical stage 2, a recess 3 between the outer body 1, a cylindrical stage 5, a bore hole 6 which may include inner thread (or threads) (not shown), distal outer thread (or threads) 7 and proximal outer thread (or threads) 8.

FIG. 5 illustrates the usage of the double-threaded connector or spacer according to principles of the present disclosure. As illustrated in cross-section, a daughter card/module 9, a connector 10, a carrier 11, a double-threaded connector or spacer 12, and a screw 18 is shown. The double-threaded connector or spacer 12 can be installed to the required position depending on the size of the daughter card (e.g., M.2 Module). According to principles of the present disclosure, the double-threaded connector or spacer 12 is screwed directly into the carrier or PCB 11, for example, into a mounting hole 14. As illustrated in FIG. 4, the mounting holes may be located in the carrier to accommodate various daughter card sizes, which may be commercial or standard, such as 42 mm, 60 mm and 80 mm. The mounting hole diameter in the PCB is in relation to the outer thread 4. That is, the outer thread (or threads) 4 of the double-threaded connector or spacer are sized to be accommodated appropriately in the mounting holes 14. A screw 13 is used to clamp the daughter card 9 to the double-threaded connector or spacer 12.

The mounting holes in the carrier or PCB 11 may be plated with conductive metal, such as copper or other known conductive metal, or may be unplated, to facilitate reliable electrical contact for grounding of the daughter card to the mother card or other purpose. The mounting hole may be electrically connected pad at the top side if the daughter card needs grounding. The diameter of the mounting hole will depend on the interior mounting hole finish (e.g., plated or not). In addition, the diameter of the mounting hole is a function of the torque force to be applied during installation and the tightness of the installed double-threaded connector or spacer. Also, the acceptable deformation in the PCB and the mounting hole also is considered in determining the diameter of the mounting hole.

Figure 6A:
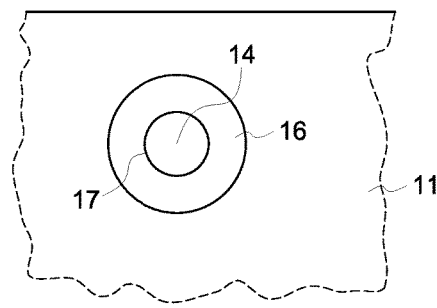
FIGS. 6A and B illustrate aspects of the electrically conductive cylinder on the carrier.
Figure 6B:
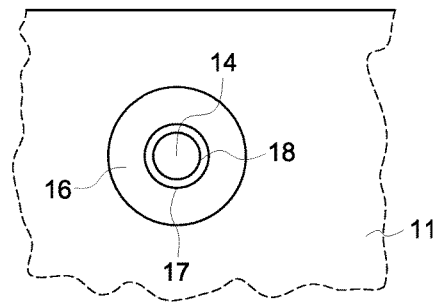

FIGS. 6A and 6B illustrate a cut-away section of the PCB 11 at a mounting hole 14. As illustrated in FIGS. 6A and 6B, the mounting hole 14 of the carrier 11, for example, a PCB, may include a metalized cylinder 16 or cylindrical plate that makes contact with the underside of the double-threaded connector or spacer (not shown) when the double-threaded connector or spacer (not shown) is mounted on the carrier/PCB. The diameter of the board hole may range from about 3.5 mm to about 3.8 mm, but need not be so limited and may be as appropriate for the carrier used and the daughter card or board chosen for mounting. The cylinder 16 includes a center hole or central opening 17. As illustrated in FIG. 6A, the size (diameter) of the center hole 17 may be substantially matched to the size (diameter) of the mounting hole 14 in the carrier 11. In an aspect, the center hole 17 size (diameter) may be larger than the size (diameter) of the mounting hole 14 such that a "gap ring" 18 of carrier may exist around the mounting hole. The cylinder 16 may be made of metal or metal alloy or other electrically conductive material or may be made of any suitable material that is coated with metal to create an electrically conductive contact. If the material making up the cylinder is not electrically conductive, or is not sufficiently electrically conductive, the cylinder may be fully or partially plated with an electrically conductive material to form an electrically conductive layer on an outer surface of the cylinder or cylindrical stage, as determined by the application of the device. In some aspects, torque force is applied to the double-threaded connector or spacer for insertion into a mounting hole 14 having a cylinder 16 such that the bottom surface of the outer body 1 of the double-threaded connector or spacer makes contact with an upper surface of the cylinder 16 to create an electrical contact between the cylinder and the double-threaded connector or spacer, which itself is in electrical contact with daughter card/module 9.

Figure 7:
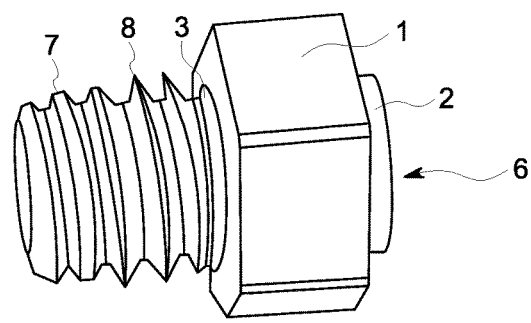
FIG. 7 illustrates an example of the present disclosure.

The double-threaded connector or spacer may be made of metal, as illustrated in FIG. 7, or may be made of any other suitable material, electrically conductive or not. If the material making up the double-threaded connector or spacer is not electrically conductive, or is not sufficiently electrically conductive, the surface of the double-threaded connector or spacer may be fully or partially electrically conductive, as determined by the application of the device. The surface may be made electrically conductive, by, for example, coating or plating on the surface of the double-threaded connector or spacer. FIG. 7 illustrates an outer body 1, a cylindrical stage 2, a recess 3 between the outer body 1, a cylindrical stage 5, a bore hole 6 which may include inner thread (or threads) (not shown), distal outer thread (or threads) 7 and proximal outer thread (or threads) 8. As illustrated, the distal outer thread 7 and the proximal outer thread 8, which together may make up an outer thread, may extend on an outer surface of the cylindrical stage an entire length of the cylindrical stage 5 or less than the entire length of the cylindrical stage 5.

In use, the double-threaded connector or spacer in accordance with principles of the present disclosure facilitates exchange of the daughter card on a PCB. That is, the double-threaded connector or spacer can be removed from the PCB from the "top" side of the carrier without having to remove solder or to access the "under" side of the carrier simply be unscrewing or otherwise detaching the double-threaded connector or spacer from the top side. Thus a different size/length daughter card can be reinstalled at the new position using the double-threaded connector or spacer. The exchange can be done from one side. It is not necessary to disassemble the carrier in order to get access from the bottom.

Figure 8:
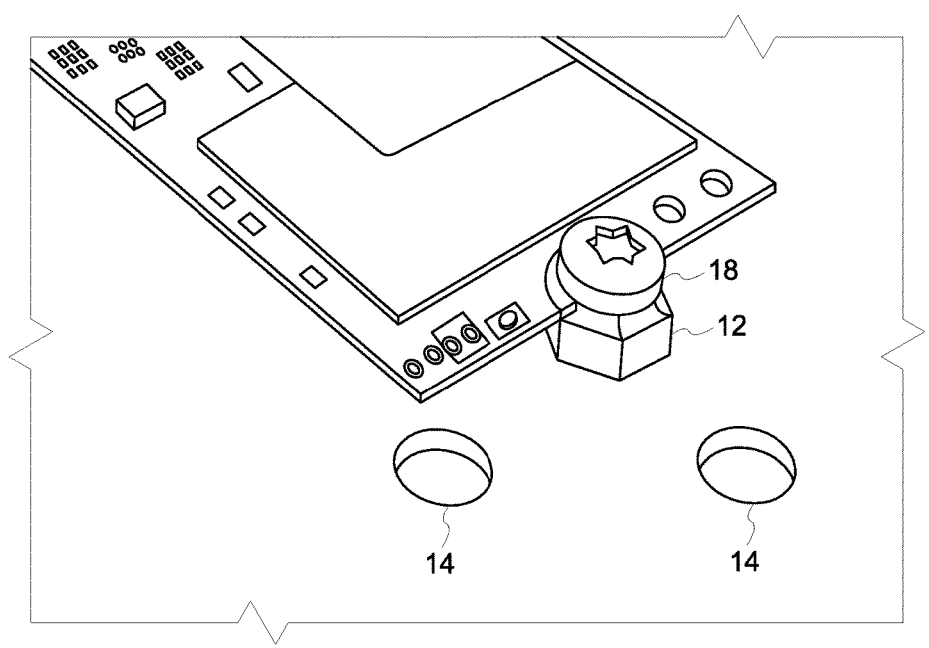
FIG. 8 illustrates the installation of a daughter card to a carrier using a double-threaded connector according to principles of the present disclosure.

FIG. 8 illustrates the installation of a daughter card to a carrier using a double-threaded connector or spacer according to principles of the present disclosure. As shown, a double-threaded connector or spacer 12 is installed in a mounting hole 14 of a carrier 11. A "half circle" portion 15 of daughter card 9 is held in place between the double-threaded connector or spacer 12 and screw 13. As can be seen, the half circle portion 15 of the daughter card is plated to make electrical contact with the double-threaded connector or spacer 12, for example, to allow for grounding of the daughter card 9 via the carrier 11, e.g., PCB. For example, an outer surface of the cylindrical stage may include an outer surface electrically conductive layer and the daughter board may include a daughter board electrically conductive region 15 so that the daughter board 9 is electrically connected to the mother board 11 via the daughter board electrically conductive region 15, the outer surface electrically conductive layer of the double-threaded connector 12 and the cylindrical plate 16.

While various examples of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described exemplary examples, but should be defined in accordance with the following claims and their equivalents.

What is claimed is:

1. An electronic assembly, comprising:
   a printed circuit board having an upper surface, the printed circuit board defining at least one mounting hole extending through the upper surface;

a cylindrical plate defining a central opening, the cylindrical plate located on the upper surface of the printed circuit board, wherein a diameter of the at least one mounting hole is less than a diameter of the central opening of the cylindrical plate;

a daughter board having a mounting recess along a side thereof;

a component extending through one of the at least one mounting holes; the component comprising:
an outer body;
a first cylindrical stage on the outer body and having a diameter less than a width of the outer body;
a second cylindrical stage extending from the outer body in a direction opposite the first cylindrical stage and having a diameter less than a width of the outer body;
a threaded bore extending through the first cylindrical stage and outer body and into the second cylindrical stage; and
an outer thread extending on an external surface of the second cylindrical stage; and
a screw extending through the threaded bore,
wherein a portion of the daughter board contacts the component.

2. The electronic assembly of claim 1, further comprising an electrically conductive layer on at least a portion of an outer surface of the second cylindrical stage.

3. The electronic assembly of claim 1, wherein the portion of the daughter board that contacts the component is the mounting recess.

4. The electronic assembly of claim 1, wherein the first cylindrical stage of the component contacts the daughter board.

5. The electronic assembly of claim 1, wherein the outer body of the component contacts the daughter board.

6. The electronic assembly of claim 1, wherein the outer thread includes a plurality of distal threads and a plurality of proximal threads, wherein the distal threads have a profile different than a profile of the proximal threads to facilitate self-threading the component within the mounting hole.

7. The electronic assembly of claim 1, wherein the central opening of the cylindrical plate is aligned with the at least one mounting hole.

8. A method of installing a daughter board on a printed circuit board, comprising:
threading a component into a mounting hole defined by the printed circuit board, the printed circuit board having an upper surface, the component comprising:
an outer body; a first cylindrical stage on the outer body and having a diameter less than a width of the outer body;
a second cylindrical stage extending from the outer body in a direction opposite the first cylindrical stage and having a diameter less than a width of the outer body;
a threaded bore extending through the first cylindrical stage and outer body and into the second cylindrical stage;
an outer thread extending on an external surface of the second cylindrical stage;
providing a daughter board adjacent the component; and
applying a screw in the threaded bore causing the component to removably clamp the daughter board to the component,
wherein a cylindrical plate is located on the upper surface of the printed circuit board, the cylindrical plate defining a central opening, wherein a diameter of the mounting hole is less than a diameter of the central opening of the cylindrical plate.

9. The method of claim 8, further comprising an electrically conductive layer on at least a portion of an outer surface of the second cylindrical stage.

10. The method of claim 8, wherein an outer surface of the second cylindrical stage includes an outer surface electrically conductive layer and the daughter board includes a daughter board electrically conductive region, the method further comprising electrically connecting the daughter board to the printed circuit board via the daughter board electrically conductive region, the outer surface electrically conductive layer and the cylindrical plate.

11. The method of claim 8, wherein threading the component into the mounting hole further includes threading the mounting hole with the component, wherein the outer thread includes a plurality of distal threads and a plurality of proximal threads, wherein the distal threads have a profile different than a profile of the proximal threads.

12. An electronic assembly, comprising:
a printed circuit board having an upper surface, the printed circuit board defining a mounting hole having a first diameter and extending through the upper surface;
a cylindrical plate defining a central opening having a second diameter, the cylindrical plate located on the upper surface of the printed circuit board, wherein the first diameter is less than the second diameter; and
a component extending through the mounting hole, the component comprising:
an intermediate body having a first width;
a first stage extending from the intermediate body, the first stage having a second width less than the first width;
a second stage extending from the intermediate body in a direction opposite the first stage, the second stage having a third width less than the first width; and
an outer thread extending on an external surface of the second stage,
wherein the component defines a threaded bore extending through the first stage and intermediate body and into the second stage.

13. The electronic assembly of claim 12, further comprising an electrically conductive layer on at least a portion of an outer surface of the second stage.

14. The electronic assembly of claim 12, further comprising a daughter board having a mounting recess along a side thereof, wherein the mounting recess contacts the component.

15. The electronic assembly of claim 14, wherein the mounting recess is semicircular.

16. The electronic assembly of claim 15, wherein the first stage of the component contacts the daughter board.

17. The electronic assembly of claim 15, wherein the intermediate body of the component contacts the daughter board.

18. The electronic assembly of claim 12, wherein the central opening of the cylindrical plate is aligned with the mounting hole.

19. The electronic assembly of claim 12, wherein the outer thread includes a plurality of distal threads and a plurality of proximal threads, wherein the distal threads have a profile different than a profile of the proximal threads to facilitate self-threading the component within the mounting hole.

* * * * *